US009412813B2

(12) United States Patent
Schulze et al.

(10) Patent No.: US 9,412,813 B2
(45) Date of Patent: Aug. 9, 2016

(54) SEMICONDUCTOR BODY WITH A BURIED MATERIAL LAYER AND METHOD

(71) Applicant: Infineon Technologies Austria AG, Villach (AT)

(72) Inventors: Hans-Joachim Schulze, Taufkirchen (DE); Anton Mauder, Kolbermoor (DE); Helmut Strack, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/643,430

(22) Filed: Mar. 10, 2015

(65) Prior Publication Data

US 2015/0187875 A1    Jul. 2, 2015

Related U.S. Application Data

(60) Continuation of application No. 14/028,065, filed on Sep. 16, 2013, now Pat. No. 8,975,151, which is a division of application No. 13/470,830, filed on May 14, 2012, now abandoned, which is a division of application No. 12/646,503, filed on Dec. 23, 2009, now abandoned.

(51) Int. Cl.
| | |
|---|---|
| *H01L 29/00* | (2006.01) |
| *H01L 29/06* | (2006.01) |
| *H01L 21/02* | (2006.01) |
| *H01L 21/311* | (2006.01) |
| *H01L 21/762* | (2006.01) |
| *H01L 21/74* | (2006.01) |

(52) U.S. Cl.
CPC ........ *H01L 29/0649* (2013.01); *H01L 21/0237* (2013.01); *H01L 21/02642* (2013.01); *H01L 21/02647* (2013.01); *H01L 21/31144* (2013.01); *H01L 21/7624* (2013.01); *H01L 21/76224* (2013.01); *H01L 21/76248* (2013.01); *H01L 21/76283* (2013.01); *H01L 21/74* (2013.01)

(58) Field of Classification Search
CPC .................................................. H01L 29/0649
See application file for complete search history.

(56) References Cited

U.S. PATENT DOCUMENTS

| | | | |
|---|---|---|---|
| 4,952,526 A | 8/1990 | Pribat et al. | |
| 6,355,497 B1 * | 3/2002 | Romano et al. | 438/39 |
| 6,500,257 B1 | 12/2002 | Wang et al. | |
| 6,825,534 B2 | 11/2004 | Chen et al. | |
| 7,947,569 B2 | 5/2011 | Mauder et al. | |
| 2002/0127856 A1 * | 9/2002 | Kunisato | H01L 33/007 438/689 |
| 2011/0147883 A1 | 6/2011 | Schulze et al. | |
| 2012/0223420 A1 | 9/2012 | Schulze et al. | |
| 2014/0017874 A1 | 1/2014 | Schulze et al. | |

* cited by examiner

*Primary Examiner* — Matthew Reames
(74) *Attorney, Agent, or Firm* — Dicke, Billig & Czaja, PLLC

(57) ABSTRACT

One aspect includes a method for forming a buried material layer in a semiconductor body, including providing a semiconductor body having a first side and having a plurality of first trenches extending from the first surface into the semiconductor body. Each of the plurality of first trenches has a bottom and has at least one sidewall and the plurality of first trenches is separated from one another by semiconductor mesa regions. A first material layer is formed on the bottom of each of the plurality of first trenches such that the first material layer leaves at least one segment of at least one sidewall of each of the plurality of trenches uncovered. Each of the plurality of first trenches is filled by epitaxially growing a semiconductor material from the at least one uncovered sidewall segment. After filling the first trenches, second trenches are formed in the mesa regions.

10 Claims, 13 Drawing Sheets

SEMICONDUCTOR BODY WITH A BURIED MATERIAL LAYER AND METHOD

CROSS-REFERENCE TO RELATED APPLICATIONS

This application is a Continuation of U.S. patent application Ser. No. 14/028,065, entitled "SEMICONDUCTOR BODY WITH A BURIED MATERIAL LAYER AND METHOD", having a filing date of Sep. 16, 2013, which is a Divisional of U.S. patent application Ser. No. 13/470,830, entitled "SEMICONDUCTOR BODY WITH A BURIED MATERIAL LAYER AND METHOD," having a filing date of May 14, 2012, which is a Divisional of U.S. patent application Ser. No. 12/646,503, entitled "SEMICONDUCTOR BODY WITH A BURIED MATERIAL LAYER AND METHOD," having a filing date of Dec. 23, 2009, all of which are incorporated herein by reference.

BACKGROUND

One aspect of the disclosure relates to forming a buried material layer in a semiconductor body. SOI substrates include a buried insulation layer arranged between two semiconductor layers. For forming an SOI substrate different methods are known.

A thin semiconductor layer is bonded to the oxidized surface of a semiconductor substrate using a wafer bonding method. The thin semiconductor layer may be obtained by cutting of a thin layer of a semiconductor substrate using the "Smart-Cut" method.

Oxygen is implanted into a semiconductor substrate followed by a temperature process. Due to the temperature process an oxide layer is formed in the region of the substrate into which the oxygen atoms have been implanted. In this method the depth of the buried oxide layer is dependent on the implantation energy of the implantation process, with the maximum depth being limited by the maximum available implantation energy.

For these and other reasons there is a need for the present invention.

SUMMARY

One embodiment relates to a semiconductor arrangement including: a semiconductor body having a first surface; a buried material layer in the semiconductor body. The buried material layer is arranged distant to the first surface, a monocrystalline semiconductor material is arranged between the material layer and the first surface, and a monocrystalline semiconductor material adjoins the material layer in a lateral direction of the semiconductor body.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The drawings should help to understand the basic principle, so that only features necessary for understanding the basic principle are illustrated. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIGS. 1A-1D illustrate an example of a method for producing a buried material layer in a semiconductor body 100. For illustrating the method FIGS. 1A-1D each illustrate a vertical cross section through the semiconductor body 100. Semiconductor body 100 has a first surface 101, which will also be referred to as front surface or front side in the following, and a second surface, which will also be referred to as back surface or back side in the following. The vertical section plane runs perpendicular to the first and second surfaces 101, 102.

Figure 1A:
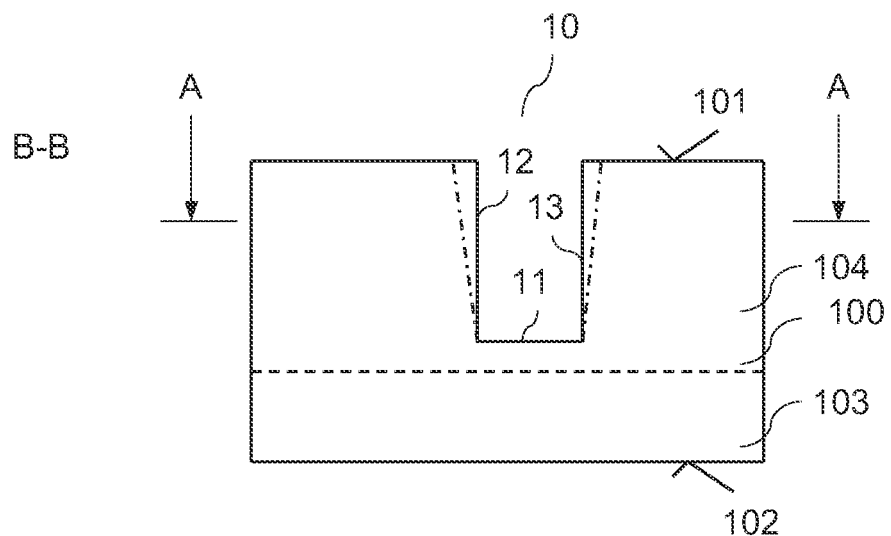
FIGS. 1A-1D illustrate one embodiment of a method for producing a buried material layer in a semiconductor body.

Referring to FIG. 1A the method starts with providing the semiconductor body 100 that includes a trench 10 extending into the semiconductor body 100 from the first surface 101. Semiconductor body is a semiconductor body of any semiconductor material, such as, for example, silicon (Si), silicon carbide (SiC), gallium arsenide (GaAs), etc. Semiconductor body 100 is in particular a monocrystalline semiconductor body 100. Semiconductor body 100 may have a homogeneous doping concentration, or may include different semiconductor layers 103, 104 (illustrated in dashed lines) that have different doping concentrations. A semiconductor body 100 including differently doped semiconductor layers may be obtained by providing a semiconductor substrate 103 having a first doping concentration, and by epitaxially growing a semiconductor layer 104 having a second doping concentration on the semiconductor substrate 103.

In the example illustrated, the first trench 10 extends from the first surface 101 in a vertical direction into the semiconductor body 100. First trench 10 has a bottom 11, and has sidewalls 12, 13. Sidewalls 12, 13 may be vertical sidewalls, or may be tapered sidewalls. "Tapered" means that the sidewalls 12, 13 are inclined compared to a vertical direction of the semiconductor body, with an angle between the sidewalls 12, 13 and the vertical direction ranging between 0° and 30°, in particular between 0° and 10°. The sidewalls may have a positive or a negative taper, where in the first case the trenches are getting wider in the direction of the first surface, and where in the second case the trenches are getting narrower in the direction of the first surface. Tapered sidewalls of the first trench 10 are illustrated using dash-dotted lines in the drawings.

The first trench 10 may be produced using any known method for producing trenches in a semiconductor body, these methods may involve forming a patterned mask (not illustrated) on the first surface 101 of the semiconductor body 100, and etching the trench in those regions not covered by the mask. A depth d of the first trench 10 is, for example, in the range between 100 nm and 20 μm, and the width of the first trench 10 is, for example, in the range between 50 nm and 10 μm. The depth d of the first trench 10 is its dimension in the vertical direction. In connection with the present disclosure the width w of trench 10 is its smallest lateral dimension. This will be explained in detail with reference to FIGS. 3 and 4 further below.

According to a first embodiment trench 10 illustrated in FIG. 1A is a trench that directly results from a trench manufacturing process, such as an etching process explained above. According to a further embodiment after etching a trench additional method steps are performed in order to obtain the trench 10 illustrated in FIG. 1A. These method steps may involve partially filling trench resulting from the etching process with a semiconductor layer 110 (illustrated in dashed lines). Semiconductor layer 110 has, e.g., a material that is different from the semiconductor material of the semiconductor body 100 or that has a different doping type or doping concentration. Semiconductor layer 110 is, e.g., epitaxially grown on the surfaces of the etched trench. For explanation purposes it is assumed that the semiconductor body 100 is made of silicon and is of a first doping type. In this case at least one of the following applies to the semiconductor material of the semiconductor layer 110: The semiconductor layer 110 is made of a material different from silicon, such as silicon-germanium (SiGe); the semiconductor layer 110 has a doping concentration of the first doping type that is different from the doping concentration of the semiconductor body in the region surrounding the trench; the semiconductor layer 110 has a doping concentration of the second doping type.

Figure 1B:
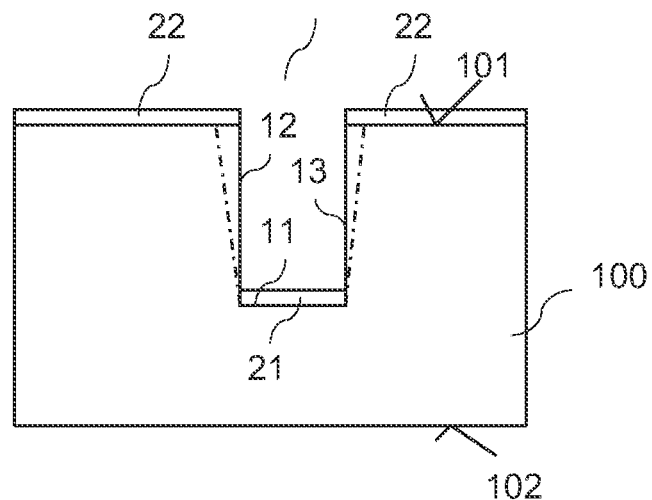

Referring to FIG. 1B a first material layer 21 is formed on the bottom 11 of the first trench 10. First material layer 21 is, for example: a dielectric layer, such as an oxide layer; an electrically insulating layer; an electrically conductive layer, such as a metal layer; or a semiconductor layer, having one of a different doping concentration compared to the semiconductor body 100 in the region surrounding the first trench 10, and a different crystalline structure; a sacrificial layer, such as a carbon or a carbide layer.

An oxide layer as the first material layer 21 is, for example, formed by employing a HDP (high density plasma) deposition process. HDP deposition processes are plasma supported deposition/sputter processes that are commonly known, so that no further explanations are required. In a HDP process the deposition rates for depositing material on horizontal surfaces of a semiconductor body, such as bottom 11, and on vertical, or on compared to the vertical direction tapered surfaces, such as sidewalls 12, 13, are different. The HDP process is, in particular, selected to have a higher deposition rate on the bottom 11 than on the sidewalls 12, 13, where in an ideal case no material is deposited on the sidewalls 12, 13. If material is also deposited on the sidewalls 12, 13 then this material may be removed from the sidewalls 12, 13 by an etching process, such as an isotropic etching process. This etching process also etches the first material layer on the bottom 11. However, since due to the properties of the HDP process the first material layer 21 on the bottom 11 is thicker than the material layer deposited on the sidewalls 12, 13 the layer on the sidewalls 12, 13 is completely removed before the first material layer 21 on the bottom 11 is completely removed. As a result the structure illustrated in FIG. 1B is obtained, that includes a first material layer 21 on the bottom 11 of the first trench 10, with segments of the sidewalls 12, 13 being uncovered. "Uncovered" in this connection means, that segments of the sidewalls 12, 13 are not covered by a material layer having the material of the first material layer 21. In the embodiment according to FIG. 1B the sidewalls 12, 13 are uncovered except for small segments in which the sidewalls adjoin the bottom and in which the material layer on the bottom extends to the sidewalls in a lateral direction.

As an alternative a sputter process or a vapor deposition process may be used for forming the first material layer.

Alternatively to using a HDP process, a sputter or a vapor deposition process, a first material layer 21 that is an oxide layer may be formed using a thermal oxidation process. During the oxidation process the sidewalls 12, 13 may be covered by a protection layer (not illustrated) that leaves the bottom 11 uncovered. Through this, a first material layer including an oxide is formed on the bottom 11 of the trench 10, but not on the sidewalls 12, 13. The protection layer covering the sidewalls is, for example, a nitride layer. The protection layer is, for example, formed by first depositing the protection layer on the whole surface of the trench, i.e., on the bottom 11 and the sidewalls, and by then removing the protection layer from the bottom 11 of trench. According to an embodiment an anisotropic etching process is used for removing the protection layer from the bottom of the trench 10. Having formed the material layer on the bottom of the trench 10, the protection layer may be removed from the sidewalls using, for example, an isotropic etching process.

Referring to FIG. 1B a first material layer 21 is also formed on the first surface 101 of the semiconductor body 100. This first material layer 21 on the first side 101 is produced when the first material layer 21 on the bottom 11 is produced, and by the same method steps.

Figure 1C:
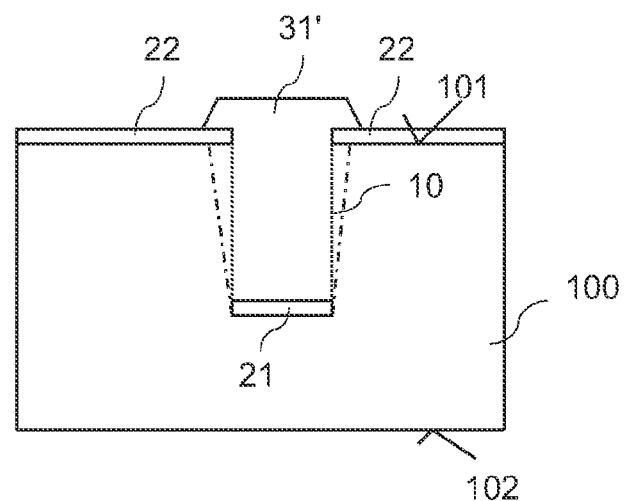

In subsequent method steps, the result of which is illustrated in FIG. 1C, the first trench 10 is filled with a monocrystalline semiconductor material. Filling the trench with the monocrystalline semiconductor material involves epitaxially growing a semiconductor material on uncovered segments of the sidewalls 12, 13 of the first trench 10. In this connection it should be mentioned that it is not necessary to have the sidewalls 12, 13 completely uncovered in order to fill the trench 10 by epitaxially growing a semiconductor material. Moreover, it is not even necessary to have one of the sidewalls completely uncovered. Having at least one segment of at least one sidewall uncovered is sufficient. The uncovered sidewall segment may have any geometry.

The lateral epitaxial growth process used for filling the trench results in an essentially defect free monocrystalline semiconductor layer above the first material layer. The epitaxial process is, in particular, a selective epitaxial process (SEG, selective epitaxial growth). In a selective epitaxial process the process parameters—such as kind of process gases, temperature, pressure, and gas flow—are adjusted such that a semiconductor layer is selectively grown on a first surface, such as the semiconductor material on the sidewalls 12, 13, but is not grown or is grown with a reduced rate on a second surface, such as on the first material layer 21 on the bottom 11 of the trench. In selective epitaxial processes the temperature is, for example, below 1050° C., or even below 1000° C., and is therefore somewhat lower than in a "usual" epitaxial process. The process gas in a selective epitaxial process includes a precursor for growing the semiconductor layer, and an etching gas that etches the semiconductor layer from the surface on which no epitaxial growth or on which epitaxial growth with a reduced growth rate is desired.

Suitable precursor gases for growing a silicon layer are, for example, dichlorosilane or trichlorosilane. The material on which a semiconductor material should not be grown or should be grown with reduced growth rate is, for example an oxide layer. Suitable additional process gases in such a process are, for example hydrochloric acid (HCl) and hydrogen ($H_2$). In such a process the precursor effects the growth of a semiconductor layer on a semiconductor material, such as on sidewalls 12, 13 of the first trench 10, and on an oxide first material layer 21 at the bottom, while the hydrochloric acid at the same time etches the grown semiconductor layer from the first material layer. By adjusting the flow-rate of the etching gas the growth rate on the first material layer 21 may be adjusted.

According to another embodiment the surfaces are not exposed to the precursor and to the etching gas at the same time, but the surfaces are alternatingly exposed to the precursor and the etching gas.

At the end of these processes first material layer 21 is buried below monocrystalline epitaxially grown semiconductor material 31'. The doping concentration of the epitaxially grown semiconductor material 31' may correspond to the doping concentration of the semiconductor body 100 in regions adjacent to the sidewalls 12, 13. However, the doping concentration of the epitaxially grown semiconductor material 31' could also be different from the doping concentration of the surrounding semiconductor material. At the end of the processes illustrated in FIG. 1D buried layer 21 is completely surrounded by monocrystalline semiconductor material, which is the material of the semiconductor body 100 and the epitaxially grown material that forms the semiconductor region 31 above the first layer.

Figure 1D:
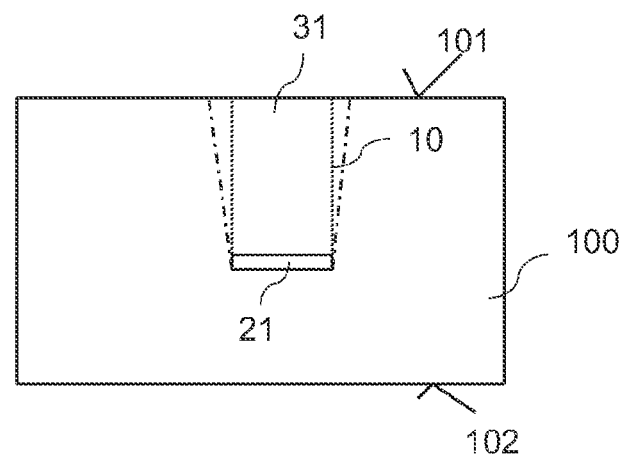

In further method steps, that are optional and the result of which is illustrated in FIG. 1D, semiconductor body 100 is planarized in the region of the first surface 101, with the planarization step including removing the first material layer 22 on the first surface 101. In the method steps illustrated in FIGS. 1B and 1C first material layer 22 on the first surface 101 prevents semiconductor material from being epitaxially grown on the first surface 101.

In the method according to FIGS. 1A-1D the duration of the deposition process is dependent on the deposition rate and on the trench width w, i.e., the duration is dependent on the distance between the two opposing sidewalls 12, 13. For a given deposition rate r and a given trench width w the duration of the deposition process is given by the ratio w/2r. Factor ½ results from the fact that starting from the two opposing sidewalls 12, 13 an epitaxial layer having a thickness of w/2 needs to be grown in order to completely fill the first trench 10. In a further example (not illustrated) in which only one of the two opposing sidewalls 12, 13 is uncovered, the deposition time is w/r. The deposition time is relevant in so far as it significantly contributes to the costs of the deposition process—and therefore to the costs of the production process—with the costs increasing with increasing deposition time.

The deposition rate is essentially independent of the depth of the first trench 10. The method is therefore particularly suitable for forming buried material layers 21 that are deeply buried in the semiconductor body.

When epitaxially growing the semiconductor material 31' on the sidewalls 12, 13 of the trench 10 in a worst case scenario voids may occur in the region of the first material layer 21. However, those voids may be avoided or may at least largely be avoided by forming the first trench 10 with tapered sidewalls.

Figure 2A:
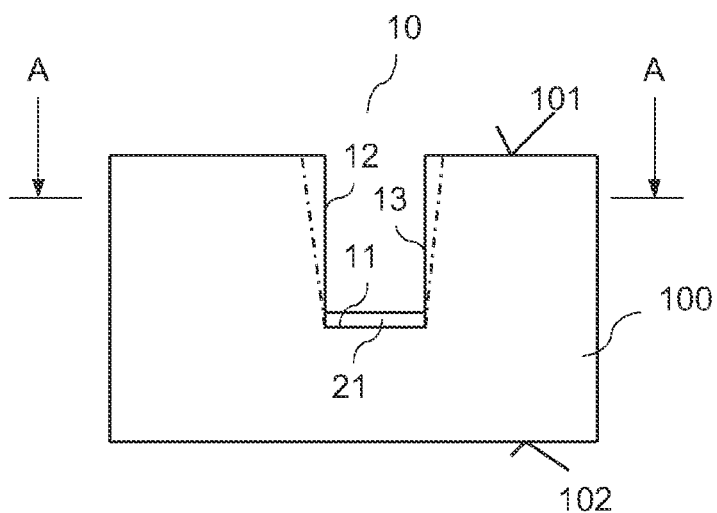
FIGS. 2A-2B illustrate a further embodiment of a method for producing a buried material layer in a semiconductor body.
Figure 2B:
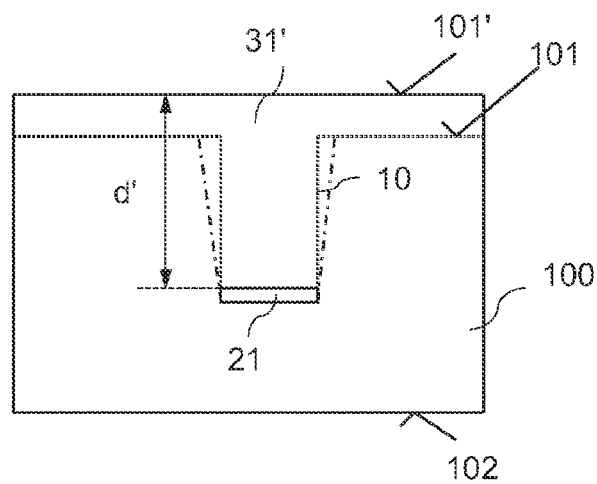

FIGS. 2A-2B illustrate a method for forming a buried first material layer 21 in a semiconductor body 100, with this method being modified as compared to the method illustrated in FIGS. 1A-1C. Referring to FIG. 2A the first material layer 21 is only formed on the bottom 11 of the first trench 10, but not on the first surface 101. According to an embodiment a material layer is first formed on the bottom 11 of the trench 10, where it forms the first material layer 21, and on the first surface 101 of the semiconductor body 100. The material layer on the first surface 101 is then removed leaving the first material layer 21 on the bottom of the trench 21. The material layer can be removed from the first surface by using an etching process, such as a recess etch. According to a first embodiment the first material layer 21 is uncovered during the etching process, so that the first material layer is also slightly etched. This embodiment is, in particular, suitable if trench 10 is a narrow deep trench, i.e., a trench having a d/w ratio higher than 10, in particular higher than 20. Due to the nature of a narrow deep trench that first material layer 21 at the bottom 11 of the trench 10 is less exposed to the etching process than the material on the first surface 101. Thus, the material on the first surface 101 can be completely removed, while the first layer 21 (with a reduced thickness) remains on the bottom 11 of the trench. According to a second example a protection layer is deposited on the first material layer 21 prior to performing the etching process. The protection layer, which is, for example, a resist layer, may have the form of a plug that fills the trench 10. The protection layer is removed after the material layer has been removed from the first surface.

When filling the first trench 10 by epitaxially growing semiconductor material on uncovered segments of the sidewalls 12, 13 semiconductor material is also grown on uncovered first surface 101. The resulting structure is illustrated in FIG. 2B. Reference number 101' in FIG. 2B denotes the first surface of the semiconductor body 100 that results from filling the trench and epitaxially growing semiconductor material on previous first surface 101. Optionally a planarization step is performed in order to achieve the planar surface 101' illustrated in FIG. 2B. In this method a distance d' between the first surface 101' of the resulting semiconductor body 100 and the first material layer 21 is not only dependent on the depth d of first trench 10 (see FIG. 1B), but also on the deposition rate and the duration of the deposition step. This method allows for producing deeply buried layers by first producing a rather shallow first trench 10, and by epitaxially growing semiconductor material on the first surface 101 and on sidewalls of the trench until a desired distance d' between first material layer 21 and the first surface 101' is reached.

In the methods illustrated in FIGS. 1A-1D and 2A-2B both of the sidewalls 12, 13 illustrated in these figures are uncovered, so that semiconductor material is epitaxially grown on both of these sidewalls. However, this is only an example. For performing these methods it is sufficient if one of the sidewalls of the first trench 10 is uncovered, or even if only a segment of one sidewall is uncovered so that semiconductor material may be epitaxially grown on this uncovered sidewall segment.

Figure 3:
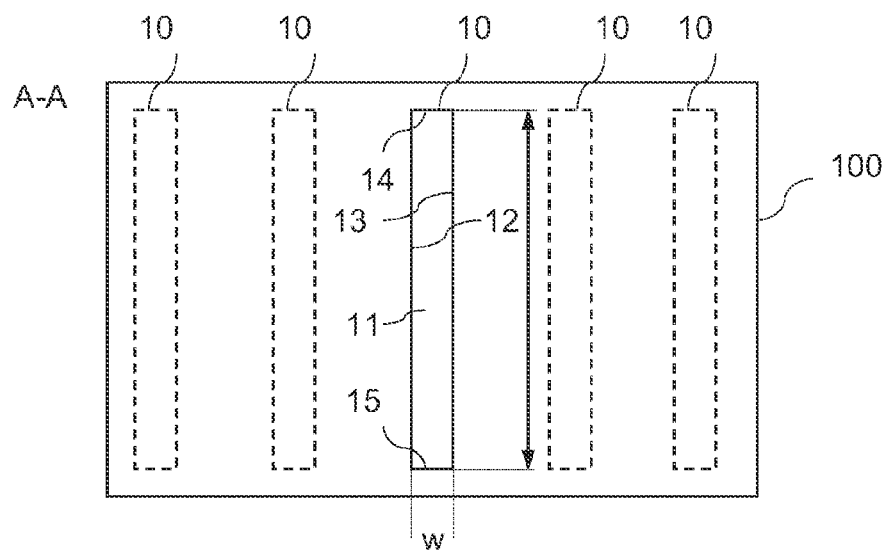
FIG. 3 illustrates a first example of a geometry of a trench that is formed in the methods according to FIGS. 1A-1D and 2A-2B.

In FIGS. 1B-1C and 2A first trench 10 is illustrated in the vertical section plane. In a horizontal section plane A-A (that is illustrated in FIGS. 1B and 2A) first trench 10 may have one of a number of different geometries. Referring to FIG. 3, that illustrates a cross section through the semiconductor body 100 in the horizontal section plane A-A, first trench may be a rectangular trench having a trench length 1 and a trench width w. According to an example a ratio l/w between the trench length 1 and the trench width w is between 1 and $10^8$. For l/w=1 trench 10 has a quadratic cross section in the horizontal section plane. FIG. 3 illustrates an embodiment in which the trench length 1 is significantly larger than the trench width, i.e., l/w>>1. The semiconductor body 100 illustrated in FIGS. 1A-1D and 2A-2B may be part of a semiconductor wafer that includes a plurality of semiconductor bodies. In this case trench 10 may extend across the complete wafer, i.e., through a number of different semiconductor bodies. A maximum length of the trench 10 is then given by the diameter of the wafer.

First and second sidewalls 12, 13 illustrated in FIGS. 1B-1C and 2A are the sidewalls that define the trench width w. Trench width w is the smallest dimension of the first trench 10 in the horizontal plane, with l being equal to w (l=w) in a trench having a quadratic cross section in the horizontal plane, and with l>w in a rectangular trench. In a rectangular trench sidewalls 12, 13 are longitudinal sidewalls, i.e., sidewalls that extend in a longitudinal direction of the trench.

As it has been explained hereinabove trench width w has a significant influence on the deposition time. Reference numbers 14 and 15 in FIG. 3 denote sidewalls of trench 10 at its longitudinal ends. If these sidewalls 14, 15 are uncovered during the deposition process, then semiconductor material is also deposited on these sidewalls. However, most of the semiconductor material that is deposited for filling the trench 10 is deposited on longitudinal sidewalls 12, 13 of the first trench 10.

Figure 4:
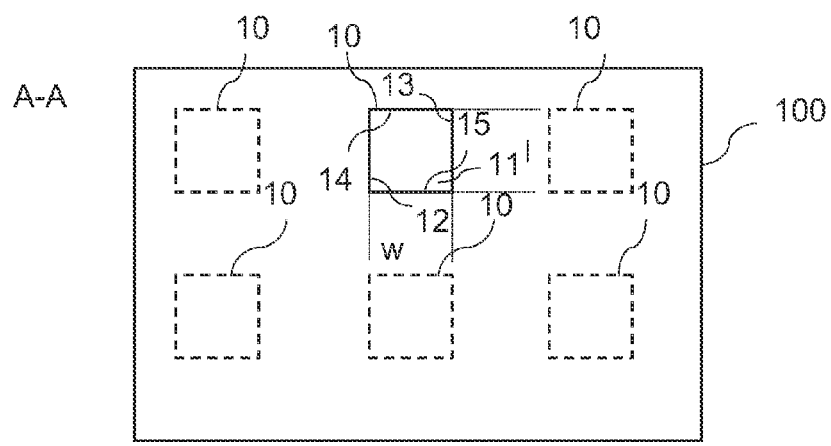
FIG. 4 illustrates a second example of a geometry of a trench that is formed in the methods according to FIGS. 1A-1D and 2A-2B.

FIG. 4 illustrates a cross section in the horizontal section plane A-A of a semiconductor body 100 that includes first trenches 10 having a square geometry or an almost-square geometry.

It goes without saying that more than one buried first material layer 21 can be produced in the semiconductor body 100 by forming several first trenches 10, and forming first material layers on the bottom of these trenches. This is illustrated in FIGS. 3 and 4 by dashed lines that represent additional first trenches 10.

Although the first trenches 10 according to FIGS. 3 and 4 are illustrated to have sharp corners between two adjacent sidewalls, it should be mentioned that these corners could be realized as "rounded" corners as well. Further, according to a further embodiment first trenches 10 have geometries in the horizontal section plane other than rectangular geometries. Other suitable geometries of the first trenches are: elliptical, in particular circular; or polygonal, such as hexagonal. Trenches having an elliptical cross section have only one sidewall that is curved. The method steps explained before for forming a trench, and forming a material layer on the bottom of trench are the same when an elliptical trench is used, with the only difference that an elliptical trench has only one (curved) sidewall for growing the semiconductor layer, so that a segment of this sidewall is to be kept uncovered before epitaxially growing the semiconductor material. In trenches that have more than one sidewall at least one these sidewalls may be left uncovered, where at least a segment of one sidewall has to be left uncovered. In trenches that have only one sidewall at least a segment of the one sidewall has to be left uncovered.

Rectangular trenches have four sidewalls, where with an increasing ratio of l/w the trench is mainly filled by the semiconductor material grown on the longitudinal sidewalls 12, 13. Hexagonal trenches have six sidewalls.

Figure 5:
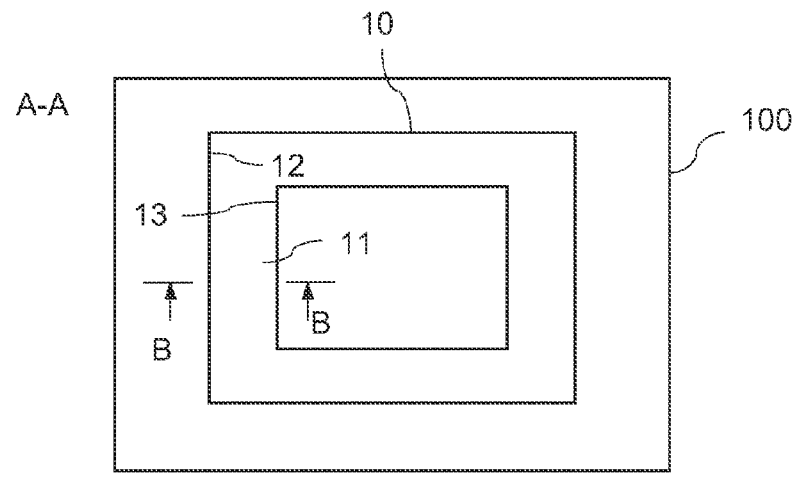
FIG. 5 illustrates a third example of a geometry of a trench that is formed in the methods according to FIGS. 1A-1D and 2A-2B.

FIG. 5 illustrates a cross section in a horizontal section plane A-A of a semiconductor body according to another example. In this example trench 10 has a ring-shaped geometry. In this example first trench 10 has a bottom 11 and has outer 12 and inner 12 sidewalls. In the example according to FIG. 5 the ring is a rectangular ring having four outer 12 and four inner 13 sidewalls, where corners between adjacent sidewalls may be rounded (not illustrated). However, alternatively trench 10 may have any other ring-shaped geometry, such as the geometry of a circular ring, an elliptic ring, etc., as well. The vertical cross sections of first trench 10 illustrated in FIGS. 1B-1C and 2A are cross sections in vertical section planes B-B illustrated in FIG. 5.

According to another embodiment (not illustrated) first trench 10 is an elongated trench that in the horizontal section plane has a meander-like geometry or a spiral geometry.

Figure 6A:
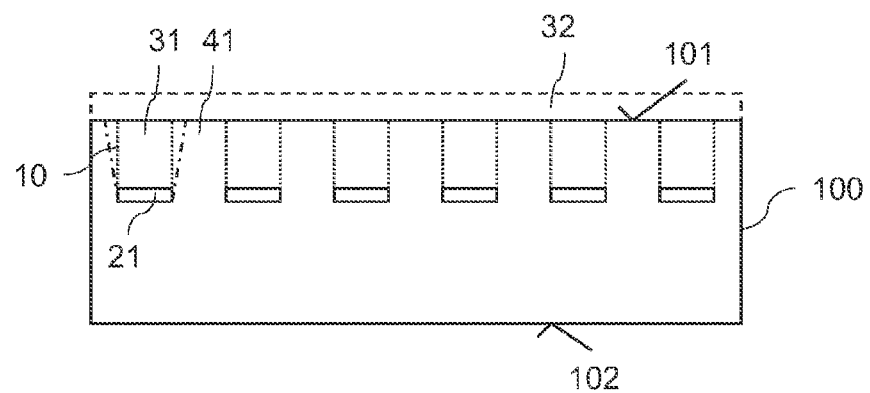
FIGS. 6A-6D illustrate another method for forming a buried material layer in a semiconductor body.

FIGS. 6A-6D illustrate a first example of a method for producing a continuous buried material layer that has a large area. Referring to FIG. 6A this method involves first producing a number of buried first material layers 21 in the semiconductor body 100. These first material layers 21 are formed using one of the methods explained hereinbefore. Forming the first material layers 21 therefore involves forming a number of first trenches 10, forming first material layers 21 on the bottom of the first trenches 10, and filling the first trenches 10 by epitaxially growing a semiconductor material on at least one uncovered sidewall of each of the trenches 10. First trenches 10 may have any of the trench geometries that have been explained before. The mutual distance between neighboring first trenches 10 may be the same for all trenches. However, this mutual distance between neighboring trenches may also vary.

The first trenches 10 in the horizontal direction of the semiconductor body 100 are separated by mesa regions 41. In the following, mesa regions 41 are those regions of the semiconductor body 100 that remain after forming the first trenches 10.

Dependent on whether a first material layer is deposited on the first surface 101 (see 22 in FIG. 1D) or is not formed on the first surface 101 (see FIG. 2A) semiconductor material 32 is grown on a first surface 101 when filling the first trenches, or is not grown on the first surface 101 during the deposition process. Optional semiconductor layer 32 that is grown on the first surface 101 is illustrated in dashed lines in FIG. 6A.

Figure 6B:
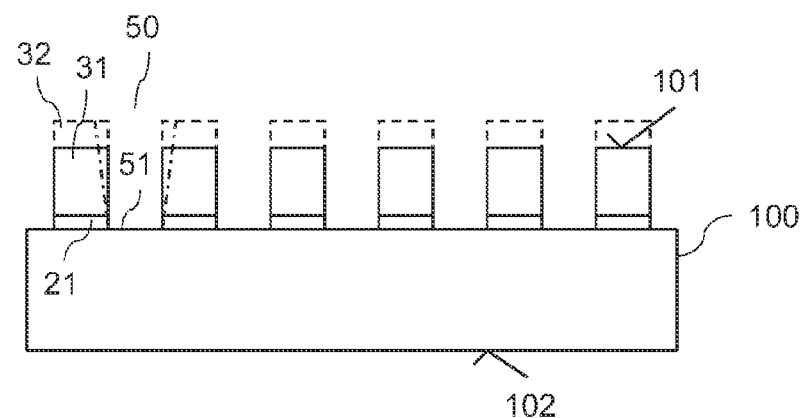

Referring to FIG. 6B second trenches 50 extending in the vertical direction of the semiconductor body 100 are formed in the mesa regions 41. These second trenches 50 each have a bottom 51 and sidewalls. A depth of these second trenches 50 is selected such that these trenches do at least extend to the level of an upper surface of the first material layers 21, but do not or do only slightly extend below the first material layer, i.e., below the level of a lower surface of the first material layers 21. The upper surface of the first material layers 21 is the surface that compared to the lower surface in a vertical direction of the semiconductor body 100 is closer to the first surface 101. In this connection it should be mentioned that the first material layers 21 are, in particular, arranged on the same vertical level of the semiconductor body 100. This may be obtained by forming the first trenches 10 with essentially identical trench depths.

Figure 6C:
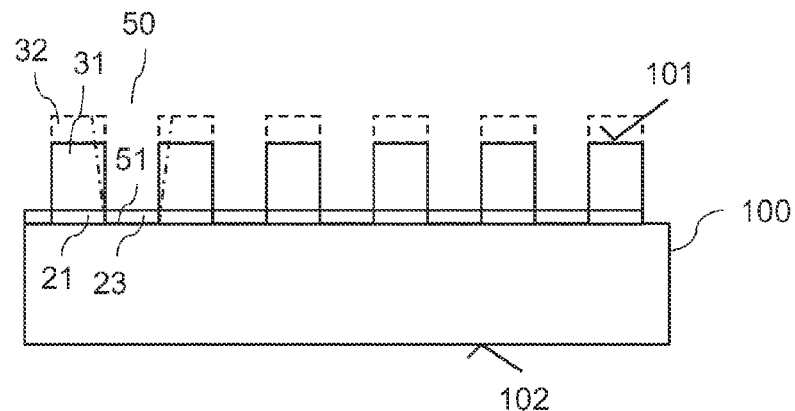

Referring to FIG. 6C second material layers 23 are produced on the bottom 51 of the second trenches 50. According to a first example the second material layers 23 are of the same material as the first material layers 21. According to a second example layers 21 and 23 are of different materials. If the first material layers 21 are, for example, of a first dielectric material, then the second material layers 23 could be of a second dielectric material.

The method steps for forming the second material layers 23 on the bottom 51 of the second trenches 50 may correspond to the method steps for forming the first material layers 21 that have been explained with reference to FIGS. 1A-1D and 2A-2B.

Figure 6D:
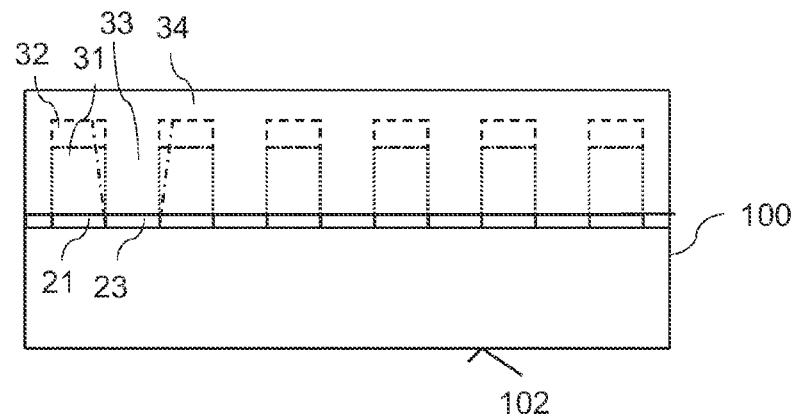

Referring to FIG. 6D the second trenches 50 are filled with a semiconductor material 33. Semiconductor material 33 is epitaxially grown on sidewall segments of the second trenches 50 until the second trenches 50 are completely filled. In the example according to FIGS. 6C and 6D second material layers 51 are only produced on the bottom of the second trenches 50, but not on the first surface 101 of the semiconductor body 100, so that semiconductor material 33 is not only grown on the bottom 51 of the second trenches 50 but also on the first surface 101 or on optional semiconductor layer 32, respectively.

In the example according to FIGS. 6B-6D the second trenches 50 are formed such that the bottom 51 of these trenches 50 lies on the level of the lower surface of the first material layers 21. In this method the second material layers 23 lie on the same vertical level of the semiconductor body 100 as the first material layers 21. Further, in this method the second trenches 50 are formed such that they completely remove the mesa regions 41, so that the second trenches 50 partly uncover the first material layers 21 near the bottom 51. The second material layers 23 formed on the bottom 51 of the second trenches 50 therefore adjoin the first material layers 21 in a horizontal direction, so that a continuous material layer, which includes the first and second material layers 21, 23, is formed. After filling the second trenches 50 by epitaxially depositing the semiconductor material on the sidewalls of these trenches material layer 21, 23 is buried below a monocrystalline semiconductor layer, which includes monocrystalline semiconductor regions 31 optional regions 32 and semiconductor regions 33. For obtaining the planar surface illustrated in FIG. 6D an optional planarization step may be performed.

Figure 7A:
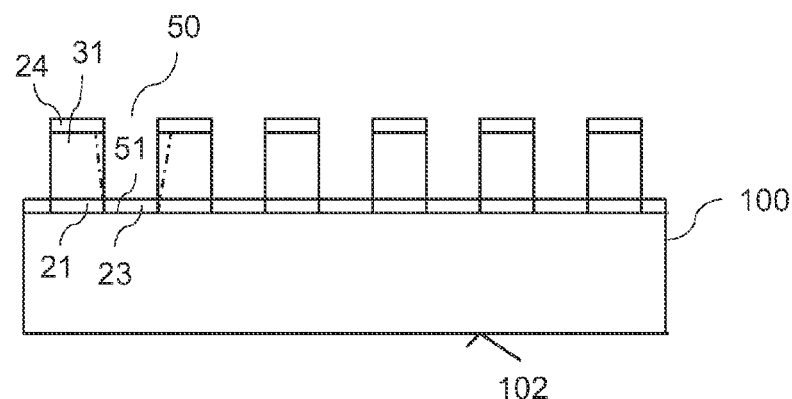
FIGS. 7A-7C illustrate a method for producing a buried layer that is based on the method according to FIGS. 6A-6D but that include some modifications.
Figure 7B:
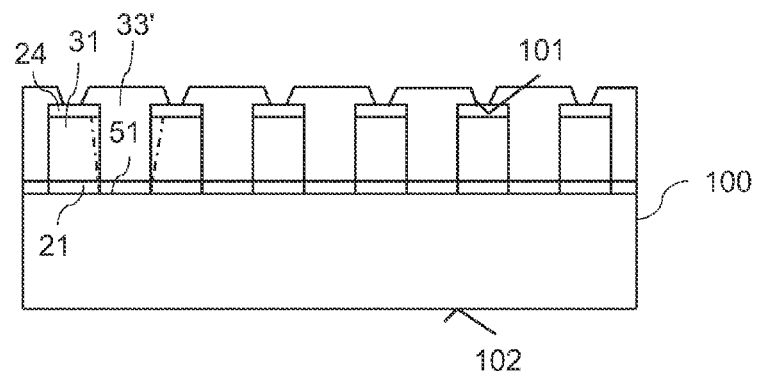
Figure 7C:
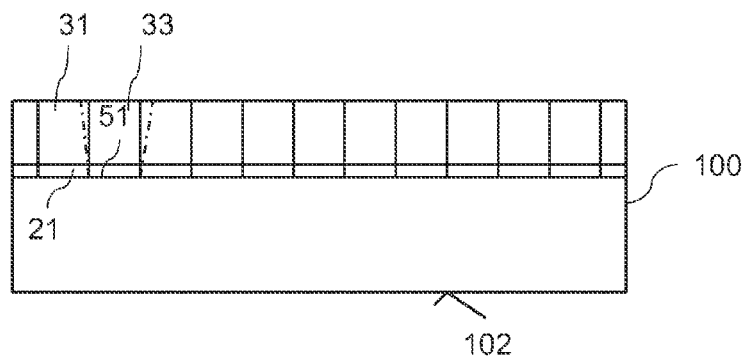

FIGS. 7A-7C illustrate a further example of a method for producing a large area buried material layer in a semiconductor body 100. This method is based on the method according to FIGS. 6A-6D and is different from this method in that when forming the second material layers 23 on the bottom of the second trenches 50 material layers 24 are also formed on top of mesa regions that remain after forming the second trenches 50.

When filling the second trenches 50 by epitaxially growing a semiconductor material on sidewalls of the second trenches 50 these material layers 24 prevent semiconductor material from being grown on the first surface 101, i.e., on top of the mesa regions remaining after forming the second trenches 50. FIG. 7B illustrates the semiconductor arrangement after filling the second trenches. Reference number 33' in FIG. 7B denotes the semiconductor region resulting from epitaxially growing semiconductor material on the sidewalls of the second trenches 50.

Optionally the semiconductor arrangement illustrated in FIG. 7B is planarized down to the mesa regions that remained after forming the second trenches 50, thereby removing the material layer 24 from the first surface 101. The result of this optional planarization step is illustrated in FIG. 7C. Reference number 33 in FIG. 7C denotes the semiconductor region that results from the semiconductor material that has been epitaxially grown to fill the second trenches.

In the two methods according to FIGS. 6A-6D and 7A-7D the second trenches 50 are formed such that the mesa regions 41 remaining after forming the first trenches 10 are completely removed. In this case second trenches need to be formed only once. However, this is only an example. According to another embodiment the first time when second trenches 50 are formed these trenches do not completely remove mesa regions 41. In this case the method steps for forming the second material layers 23 may be repeated several times until the mesa regions 41 are completely removed and replaced by a second material layer 24 covered by an epitaxially grown semiconductor region 33.

The buried material layer, which in the embodiments according to FIGS. 6D and 7C includes the first and second material layers 21, 23 can be implemented such that it completely extends across the semiconductor body or wafer, respectively. The resulting structures, i.e., the structure including the semiconductor body 100, the material layers 21, 23 and the epitaxial layers 31, 33 is similar to a SOI-structure, when the material layers 21, 23, 25 are dielectric layers. However, the explained method is also suitable for forming island-like buried material layers 21, 23, which are contiguous material layers of first and second material layers 21, 23 that do not extend through the complete semiconductor body in the horizontal plane.

FIGS. 6A-6D and 7A-7B illustrate the ideal case in which the second trenches 50 are formed such that they only remove the mesa regions 41 but that they do not overlap with the first material layers 21 in a horizontal direction. However, this requires an exact alignment of a mask that is used for forming the second trenches 50.

Figure 8A:
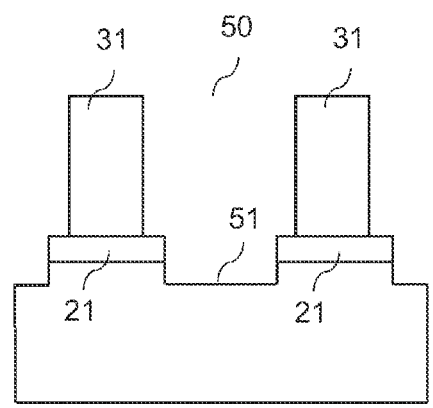
FIGS. 8A-8B illustrate modified method steps for the methods according to FIGS. 6A-6D and 7A-7C.
Figure 8B:
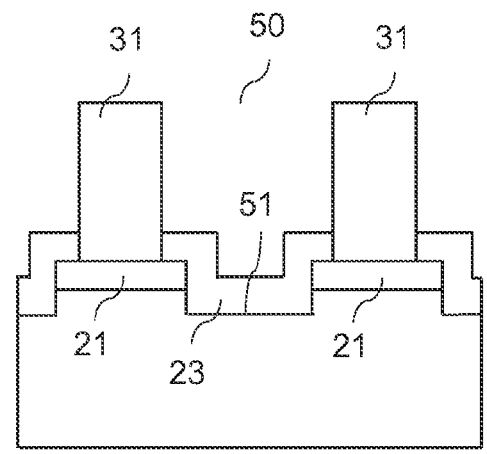

Referring to FIG. 8A that illustrates a vertical cross section through the semiconductor body 100 after forming the first material layers 21 and after forming the second trenches 50, second trenches 50 may be formed such that they overlap with the first material layers 21 in the horizontal direction. In this case first material layers 21 may serve as an etch stop in the process of etching the second trenches 50. As it is further illustrated in FIG. 8A the second trenches 50 may be formed such that their bottom 51 lies below the level of the lower surface of the first material layers 21. Referring to FIG. 8B that illustrates the arrangement after forming the second material layer 23, first and second material layers 21, 23 may be arranged offset to one another in a vertical direction. Further, the second material layers 23 overlap the first material layers. The first and second material layers 21, 23 form a material layer that due to this overlap has a varying thickness.

Figure 9A:
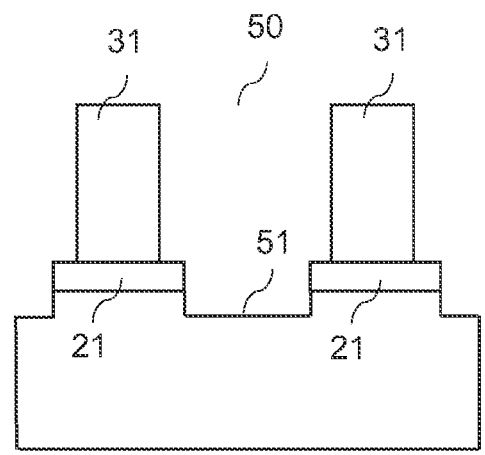
FIG. 9A-9C illustrate a modified embodiment of the method according to FIGS. 8A-8B.
Figure 9B:
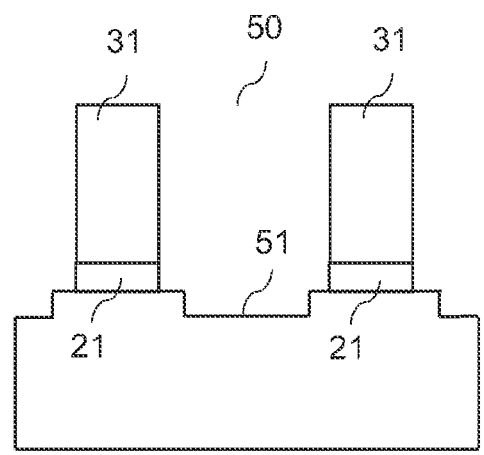
Figure 9C:
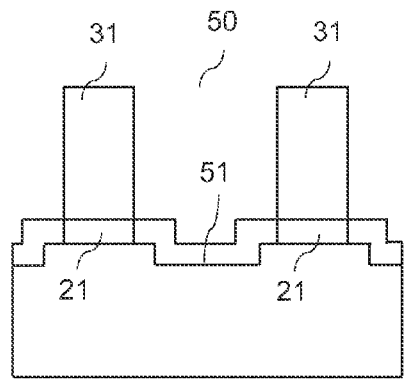

FIGS. 9A-9C illustrate a modified embodiment of the method according to FIGS. 8A-8B. Referring to FIG. 9A the second trenches 50 are formed to overlap the first material layers 21 in the horizontal direction. This is equivalent to method according to FIGS. 8A-8B. Referring to FIG. 9B those sections of the first material layers 21 that are uncovered after forming the second trenches are removed. These sections of the first material layers are removed by an anisotropic etching process, for example.

Referring to FIG. 9C, in next steps the second material layers are formed on the bottom 51 of the second trenches 50. In the structure illustrated in FIG. 9C there is no overlap between the first and second material layers 21, 23, because uncovered sections of the first material layers 21 have been removed prior to forming the second material layers 23.

Like in the method according to FIGS. 8A-8B, the second trenches 50 may be formed such that their bottom 51 lies below the level of the lower surface of the first material layers 21. Consequently the first and second material layers 21, 23 may be arranged offset to one another in a vertical direction. The offset is defined by the distance between the lower end of the first material layers 21 and the bottom 51 of the second trenches 50. This offset is, in particular, selected to be less than a thickness of the second material layers 23, so that despite this offset the first and second material layers 21, 23 adjoin one another in the lateral direction, thereby forming a continuous buried material layer.

FIGS. 10A-10D illustrate a method for producing a monocrystalline semiconductor region in a semiconductor body that in the semiconductor body is surrounded by a material layer, such as a dielectric layer, for example. Monocrystalline semiconductor regions surrounded by a dielectric or insulating layer—i.e., that are separated from other semiconductor regions of the semiconductor body 100 by a dielectric or insulating layer—may be used for producing integrated semiconductor components or parts of semiconductor components that are isolated from other semiconductor components or other parts of semiconductor components integrated in the semiconductor body 100. According to an embodiment a power transistor, such as a vertical DMOS transistor, and a drive circuit of the power transistor are integrated in a common semiconductor body, where components of the drive circuit are arranged in such an insulating well and are connected with the drive (gate) terminal of the power transistor via connecting lines.

Figure 10A:
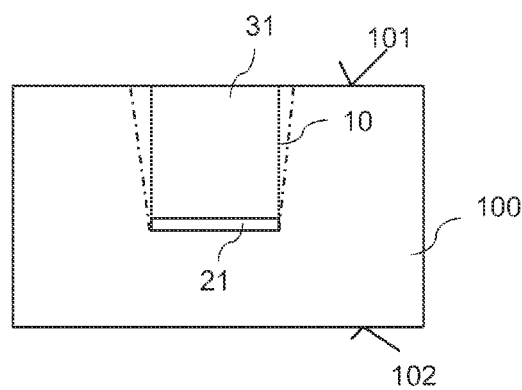
FIGS. 10A-10D illustrate one embodiment of a method for producing a material layer surrounding a semiconductor region in a semiconductor body.

Referring to FIG. 10A a buried material layer 20 is produced in the semiconductor body 100. The buried layer 20 is, for example, a first material layer, such as the first material layer explained with reference to FIGS. 1A-1D and 2, or is, for example, a layer including a number of first and second material layers, such as first and second material layers 21, 23 explained with reference to FIGS. 6 to 9.

The buried material layer 20 is arranged distant to the first surface 101, a monocrystalline semiconductor material being arranged between the buried material layer 20 and the first surface 101, Further, a monocrystalline semiconductor material adjoins the buried material layer 20 in a lateral direction of the semiconductor body 100, i.e., the buried layer 20 does not extend to the edge (not illustrated) of the semiconductor body 100 in the lateral direction.

Referring to FIG. 10A the buried material layer 20 is essentially parallel to the first surface. The buried layer 20 is, for example, a dielectric layer.

Figures 10B, 10C:
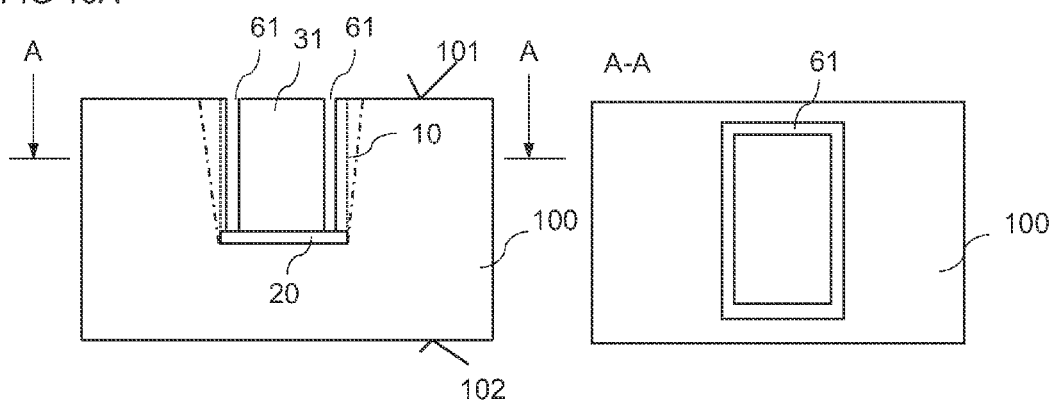

Referring to FIGS. 10B and 10C a ring-shaped trench 61 is formed in the semiconductor body 100. Ring-shaped trench 61 extends in a vertical direction of the semiconductor body 100 from the first surface 101 down to the first material layer 21.

Figure 10D:
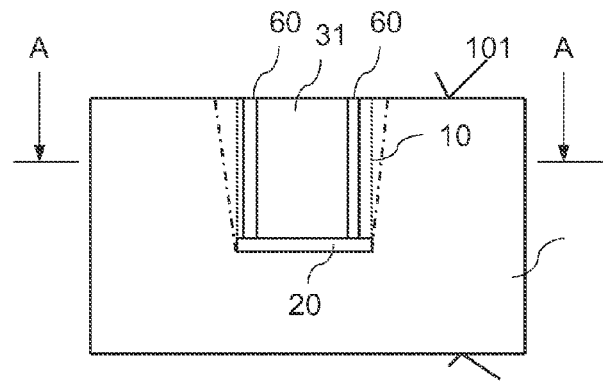

Referring to FIG. 10D a material layer 60 is formed in the ring-shaped trench 61. Material layer 60 is, for example an oxide layer that is formed by thermal oxidation. The ring-shaped material layer 60 in the semiconductor body 100 reaches down to the first material layer 21. The material layer formed by the first layer 21 and the ring-shaped layer 60 completely enclose the semiconductor region that lies above the first material layer 21 and within the ring-shaped material layer 60. Referring to FIGS. 10A-10D the semiconductor region that is completely surrounded by the material layer 21, 60 may be a semiconductor region 31 that has been formed when filling the trenches that have been formed prior to producing the first material layer 21.

In the method according to FIGS. 10A-10D the material layer 21 that borders the enclosed semiconductor region in the vertical direction includes one first material layer 21. However, instead of using only one first material layer a buried layer that includes several first and second material layers 21, 22 (see FIGS. 6D and 7C) may be used as well.

Figure 11A:
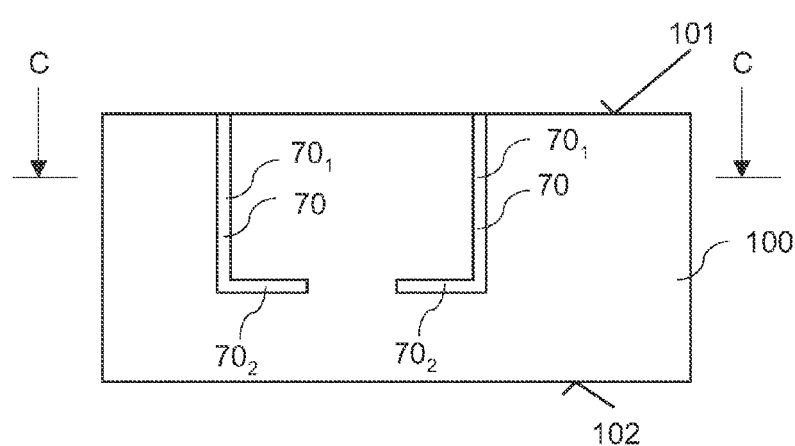
FIGS. 11A-11E illustrate a further embodiment of a method for producing a material layer surrounding a semiconductor region in a semiconductor body.
Figure 11B:
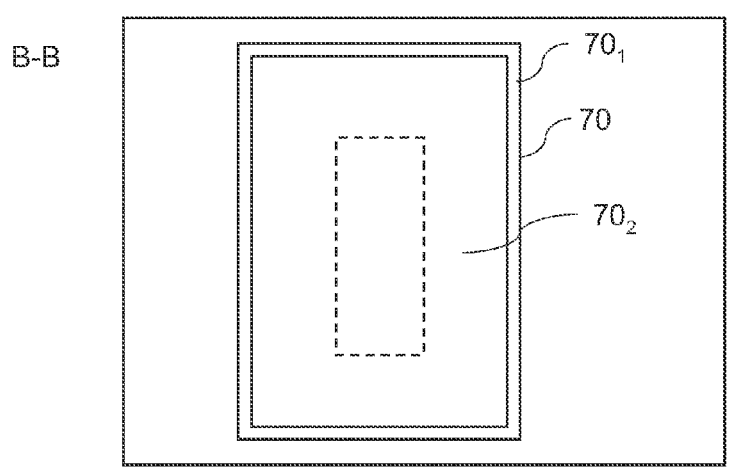

FIGS. 11A-11E illustrate a further method for producing a semiconductor region of a semiconductor body that is completely surrounded by a material layer. In this method (referring to FIGS. 11A and 11B) a ring-shaped material layer 70, which is, in particular, a dielectric layer or an electrically insulating layer, is provided in the semiconductor body 100. This material layer 70 in a vertical section plane that is illustrated in FIG. 11A is L-shaped. L-shaped means that the material layer 70 includes a first section $70_1$ that starting from the first surface 101 extends in the vertical direction, and a second section $70_2$ that adjoins the first section $70_1$ and that extends in the horizontal direction. The first section $70_1$ may be inclined as compared to the vertical direction, and the second section $70_2$ may be inclined as compared to the horizontal direction.

Figure 11C:
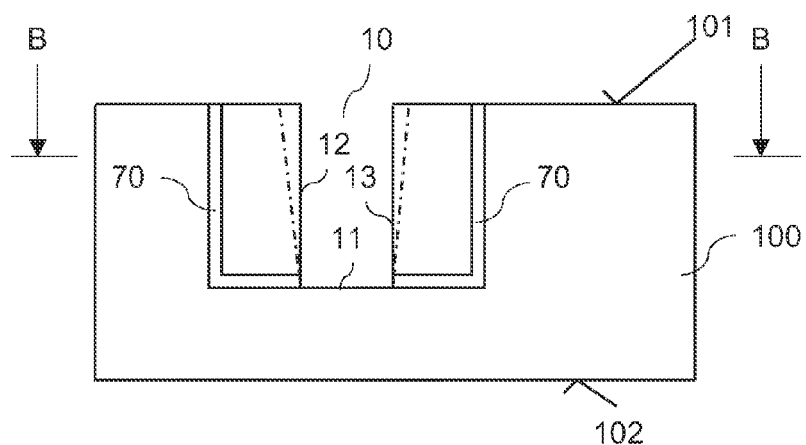
Figure 11D:
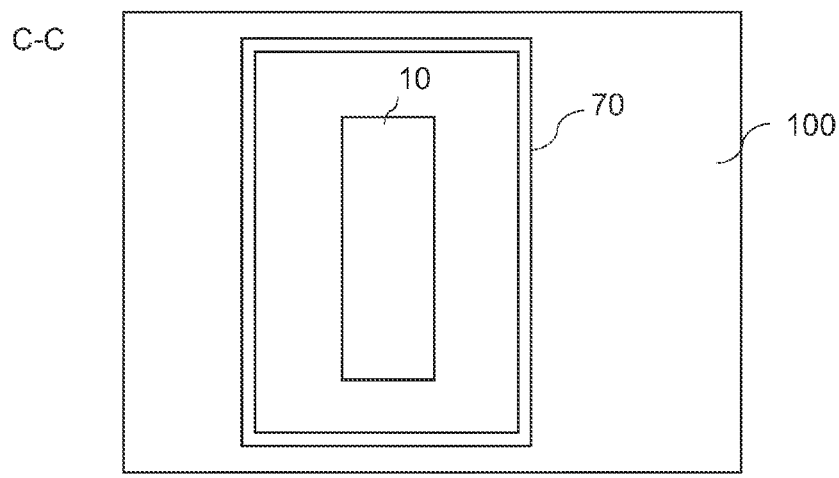
Figure 11E:
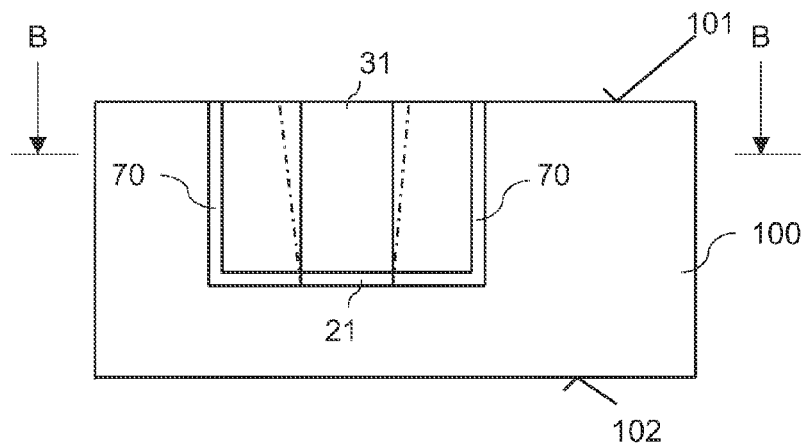

Referring to FIGS. 11C-11E the first material layer 21 is formed by producing a first trench 10 (see FIG. 11C) that in the vertical direction extends down to the second sections $70_2$ of material layer 70. In the horizontal direction first trench 70 adjoins these second sections $70_2$ or overlaps with these second sections$_2$ (not illustrated). FIG. 11C illustrates the trench in the vertical section plane, and FIG. 11D illustrates the trench in the horizontal section plane C-C.

On the bottom 11 of the first trench 10 the first material layer 21 is formed. Subsequently to forming the first material layer 21 the first trench 10 is filled by epitaxially growing a semiconductor material on at least one of the sidewalls 12, 13 of the first trench 10. The first material layer 21 adjoins the horizontal second section of material layer 70, so that material layer 70 and first material layer 21 completely enclose a semiconductor region of the semiconductor body 100.

Figure 12A:
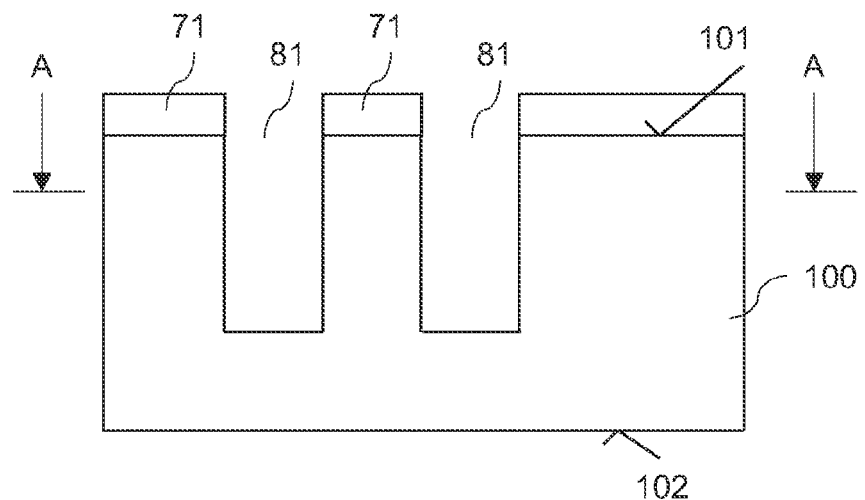
FIGS. 12A-12G illustrate a method for forming a material layer having an L-shaped cross section in a semiconductor body.
Figure 12B:
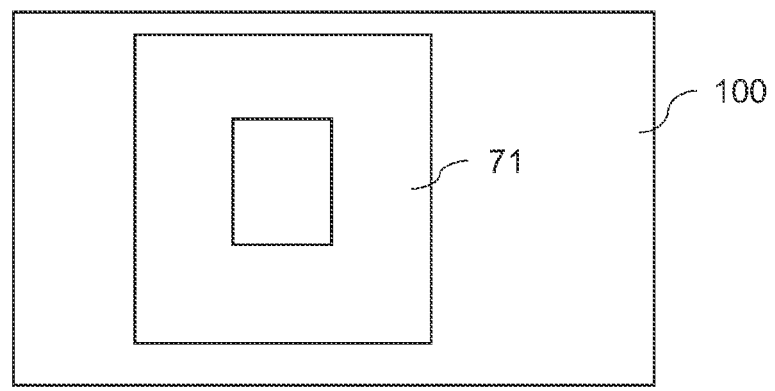

A method for forming L-shaped material layer 70 will now be explained with reference to FIGS. 12A to 12G. Referring to FIGS. 12A and 12B, that illustrate a vertical cross section and a horizontal cross section through the semiconductor body 100, a ring-shaped trench 81 is formed that starting from the first surface 101 extends into the semiconductor body in the vertical direction. Trench 81 is for example formed by an etching process using a mask 71 applied to the first surface 101. Mask 71 is, for example a patterned oxide hard mask. After etching trench 81 the mask is kept on the first surface 101 of the semiconductor body.

Figure 12C:
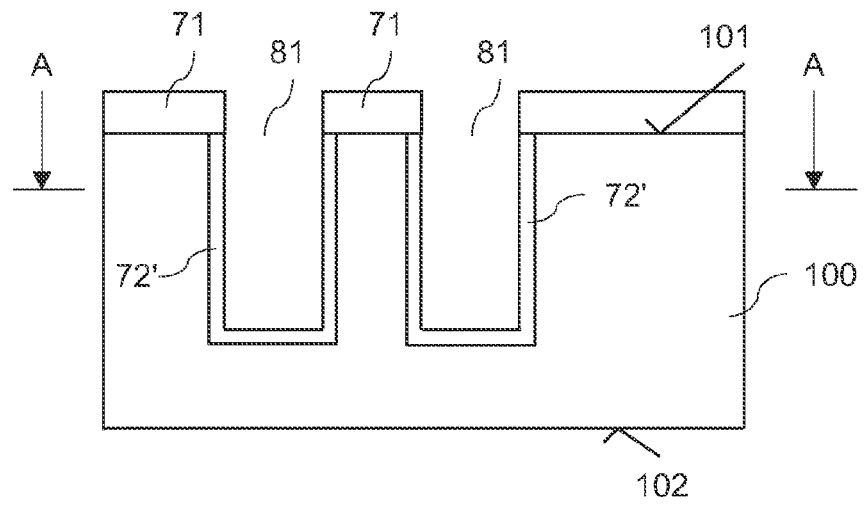

Referring to FIG. 12C a material layer 72' is formed on the bottom and the sidewalls of trench 81. Layer 72' is, for example, a dielectric layer, in particular an oxide layer. Layer 72' may be formed using a deposition process. An oxide layer 72' may be formed using thermal oxidation process.

Figure 12D:
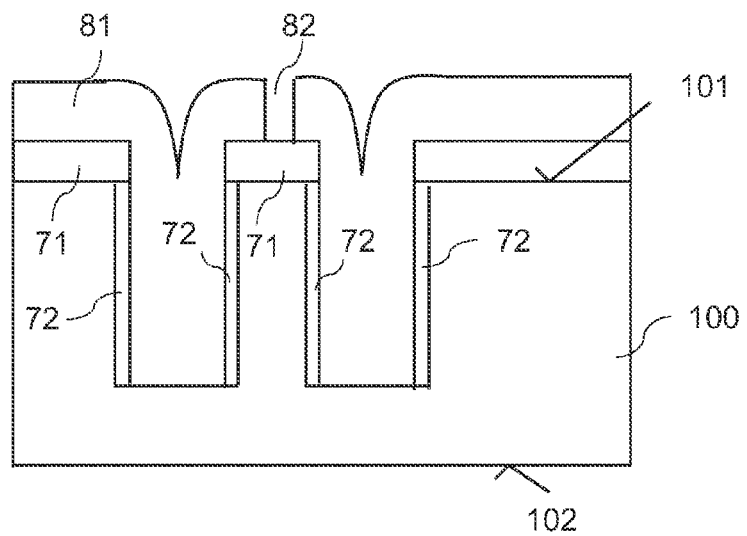

Referring to FIG. 12D layer 72' is removed from the bottom of trench 81, leaving material layers 72 on the sidewalls. Additionally, a protective layer 91 is subsequently applied to the semiconductor structure with the semiconductor body 100 and the trench 81 arranged therein, protective layer covering the mask layer 71 on the first surface and the material layers 72 on the sidewalls. Protective layer 91 may be produced with a layer thickness that is greater than 50% of the width of the trench 81 that remains after producing material layers 72. In this case-as illustrated in FIG. 12C-trench 81 is completely filled with the protective layer 91. The thickness of the deposited protective layer can also be smaller than the aforementioned 50% of the width of the residual trench. In this case, a further residual trench (not illustrated) remains after the deposition of the protective layer.

Protective layer 91 is composed, in one embodiment, of a material with respect to which the mask layer 71 and the material layers 72 can be etched selectively. In this connection, "selective etching" should be understood to mean that the foreign layers 71, 72 can be etched by an etchant that does not etch the protective layer 91 or etches it to a significantly smaller extent than the layers 71, 72. The protective layer 91 is composed of carbon, for example, and can be deposited in a CVD process (CVD=Chemical Vapor Deposition) by pyrolysis of methane ($CH_4$). During the pyrolysis, from the methane a solid layer of carbon (C), which forms the protective layer 301, and volatile hydrogen ($H_2$) is generated. Material layers 71, 72 that are, for example, composed of an oxide, such as silicon dioxide, can be etched selectively with respect to such a protective layer 91 composed of carbon, for example, by using a solution containing at least one of hydrofluoric acid, and ammonium fluoride.

Figure 12E:
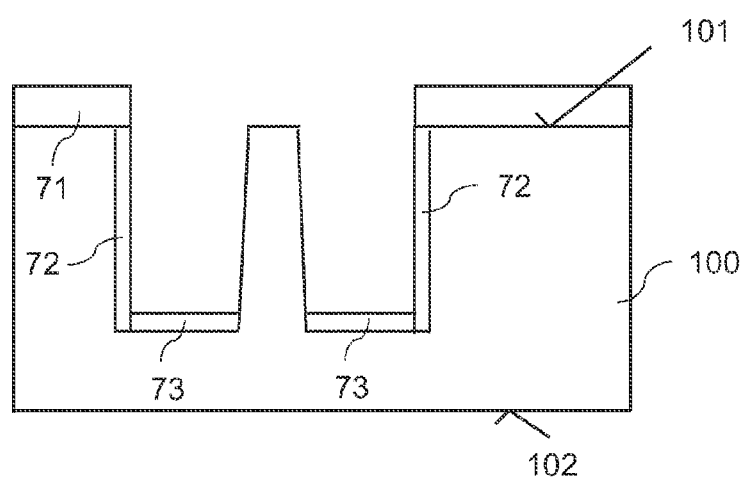

Referring to FIG. 12E material layers 72 are removed from inner sidewalls of the ring-shaped trench 81. For this purpose, protective layer 91 is patterned above the front surface 101 of the semiconductor body 100 in such a way that the protective layer 91 has an opening 92 above the inner sidewalls of trench 81. Referring to FIG. 12C opening 92 may be arranged offset in a lateral direction with respect to the inner sidewalls. Opening 92 is produced, for example, using a patterned mask (not illustrated) The mask has a opening in the region in which the opening 92 of the protective layer 91 is intended to be produced, and thus enables the protective layer 91 to be etched selectively in the region in which the opening 92 is intended to be produced. The mask is composed, for example, of an oxide, such as e.g., $SiO_2$, or a nitride, such as e.g., $Si_3N_4$, and can be produced, for example, by using a CVD or PECVD (Plasma Enhanced Chemical Vapor Deposition) process. When a carbon layer is used as the protective layer 91, opening 92 is produced, for example, by using an oxygen plasma process or by using a thermal process in an oxygen-containing or ozone-containing environment. By using these processes, the carbon layer is converted into carbon dioxide ($CO_2$) and thereby removed. The mask layer is not attacked by the processes and thereby protects the regions of the carbon layer 91 which are not intended to be removed. During these processes, an undercut of the mask layer 91 can occur in part, although this is not explicitly illustrated in the figures. One advantage of using a carbon layer as the protective layer 91 is that it can be removed on the basis of the processes explained without any residues and with high etching rates of 300 nm/min or more.

For removing layer 72 from the inner sidewalls via the opening 92 produced in the protective layer 91, material layer 72 is subjected to an etching material which etches the material layer 72 selectively with respect to the protective layer 91 and the semiconductor body 100. When using silicon as material of the semiconductor body 100, a carbon layer as the protective layer 91 and a silicon oxide layer as the foreign material layer 72, the etching material is, for example, a solution containing hydrofluoric acid or containing ammonium fluoride. If the opening 92 of the protective layer 91 is situated offset with respect to the inner sidewall in a lateral direction of the semiconductor body 100, then the etching material firstly removes that section of the mask layer 71 which is situated directly on the front surface 101 before etching material 72 on the inner sidewalls.

The etching materials mentioned each have a high selectivity with respect to a carbon layer as protective layer 301 and a semiconductor body 100 composed of silicon, that is to say that they have a high etching rate with respect to the layers 71, 72 and only a low etching rate with respect to the semiconductor body 100 and the protective layer 91. A ratio of the etching rate of the material layers 71, 72 to the etching rate of the semiconductor body 100 lies, for example, in the range of 500:1 to 10 000:1 or higher. One variant of the method explained provides for reducing the selectivity of the etching material with respect to the material of the semiconductor body 100. In the case of the abovementioned solutions containing hydrofluoric acid or containing ammonium fluoride, this can be done, for example, by adding nitric acid. The result of this reduction of the etching selectivity is that during the etching process the semiconductor body 100 is also etched in the region of the second sidewall 12, which leads as a result to a sidewall that is tapered with respect to the vertical. Such a tapered sidewall facilitates later filling of the trench with a semiconductor material by epitaxially growing a semiconductor layer.

After removing material layer 72 from the inner sidewall protective layer 91 is removed, and a further material layer 73 is formed on the bottom of the trench 81. Forming material layer 73 may, for example, be formed using any of the methods that have been explained with reference to FIGS. 1A-1D and 2A-2B.

Figure 12F:
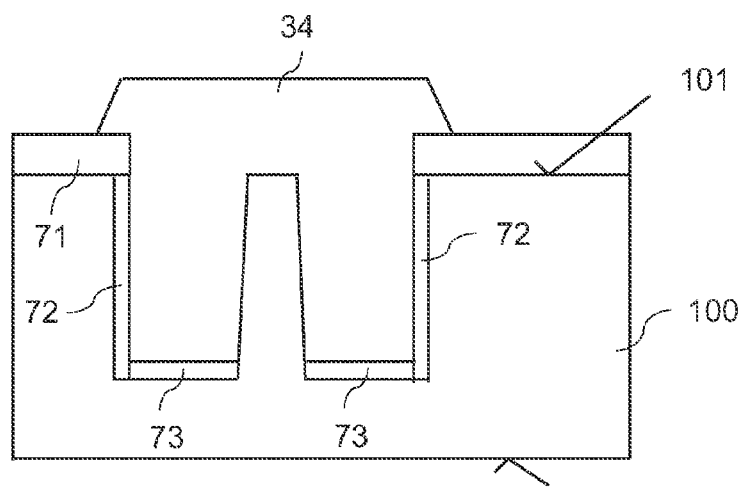

Referring to FIG. 12F trench 81 is then filled by epitaxially growing a semiconductor material an the inner sidewalls. Layer 71 on the first surface prevents semiconductor material from being grown on the first side.

Figure 12G:
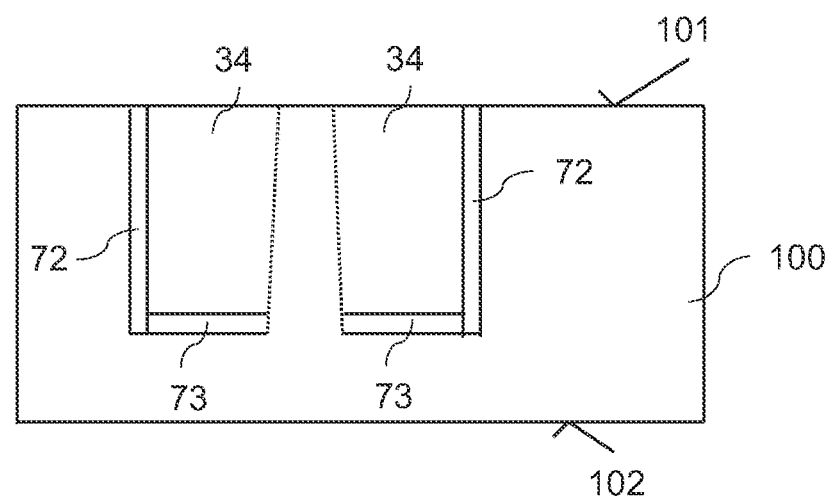

Finally, the arrangement including the semiconductor body 100 and the mask layer 71 on its first surface is planarized down to the first side, thereby removing mask layer 71. The result of this is illustrated in FIG. 12G. Referring to FIG. 12G layer 72 on the outer sidewalls of former trench 81, and layer 73 on the bottom of former trench 81 together form the L-shaped layer (70 in FIGS. 10A, 10B) that partially forms the material layer that completely surrounds the semiconductor region. Layers 72, 73 are, in particular, layers of the same material, such as an oxide.

According to one example layers 72, 73 that have been formed using the method steps according to FIGS. 12A-12G are removed, for example by an etching process, and are replaced by another material layer, such as, for example, a thermal oxide.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement comprising:
a semiconductor body having a first surface;
a buried material layer in the semiconductor body;
wherein the buried material layer is arranged distant to the first surface,
wherein a monocrystalline semiconductor material is arranged between the material layer and the first surface,
wherein a monocrystalline semiconductor material adjoins the buried material layer in a lateral direction of the semiconductor body, and
wherein the buried material layer comprises a plurality of first material layers and a plurality of second material layers, wherein the first material layers are arranged alternatingly in a lateral direction of the semiconductor so that each of the plurality of first material layers, in the lateral direction, adjoins two of the plurality of second material layers so that the plurality of first material layers and the plurality of second material layers are contiguous with each other and form the buried material layer,
wherein each of the plurality of first layers is arranged on a respective one of a plurality of first surfaces of the semiconductor body and each of the plurality of second layers is arranged on a respective one of a plurality of second surfaces of the semiconductor body, and
wherein the plurality of first surfaces are offset relative to the plurality of second surfaces in a vertical direction of the semiconductor body.

2. The semiconductor arrangement of claim 1, wherein the buried material layer is buried by a monocrystalline semiconductor material in the semiconductor body.

3. The semiconductor arrangement of claim 1, wherein the buried material layer is essentially parallel to the first surface.

4. The semiconductor arrangement of claim 1, wherein the buried material layer is a dielectric layer.

5. The semiconductor arrangement of claim 1, further comprising:
a further material layer adjoining the buried material layer and extending in a vertical direction of the semiconductor body.

6. The semiconductor arrangement of claim 5, wherein the further material extends to the first surface of the semiconductor body.

7. The semiconductor arrangement of claim 5, wherein the further material layer buries a semiconductor region vertically between the buried material layer and the first surface of the semiconductor body.

8. The semiconductor arrangement of claim 1, wherein each of the second material layers overlaps at least one of the first material layers.

9. The semiconductor arrangement of claim 1, wherein at least one section of at least some of the plurality of second material layers is offset in a vertical direction of the semiconductor body to the plurality of first material layers.

10. The semiconductor arrangement of claim 1, wherein at least some of the plurality of first material layers is overlapped by the at least one of the plurality of second material layers it adjoins so that there is a section of at least one of the plurality of second material layers between at least some of the first material layers and the first surface.

* * * * *